(12) United States Patent
Haag et al.

(10) Patent No.: US 6,723,933 B2
(45) Date of Patent: Apr. 20, 2004

(54) FLEXIBLE CAPACITIVE STRIP FOR USE IN A NON-CONTACT OBSTACLE DETECTION SYSTEM

(76) Inventors: Ronald Helmut Haag, 9568 Klais Dr., Clarkston, MI (US) 48348; Brian Deplae, 31515 Beechwood Dr., Warren, MI (US) 48093; Jeremy M. Husic, 57286 Suffield Dr., Washington, MI (US) 48094; John Pasiecznik, Jr., 27555 Pacific Coast Hwy., Malibu, CA (US) 90265

( * ) Notice: Subject to any disclaimer, the term of this patent is extended or adjusted under 35 U.S.C. 154(b) by 1 day.

(21) Appl. No.: 10/142,643

(22) Filed: May 10, 2002

(65) Prior Publication Data

US 2003/0081369 A1 May 1, 2003

Related U.S. Application Data

(60) Provisional application No. 60/330,171, filed on Oct. 17, 2001, provisional application No. 60/330,173, filed on Oct. 17, 2001, and provisional application No. 60/361,803, filed on Mar. 5, 2002.

(51) Int. Cl.$^7$ .................................................. H01H 3/16
(52) U.S. Cl. ................. 200/61.42; 200/600; 200/61.41; 200/61.43; 200/61.44; 49/27; 49/28
(58) Field of Search ........................ 49/26–28; 200/600, 200/61.41–61.44, 61.62, 61.71, 61.73, 61.74, 61.81, 61.82, 85 R, 85 A, 86 R, 86 A, 511, 512

(56) References Cited

U.S. PATENT DOCUMENTS

| | | | |
|---|---|---|---|
| 4,327,323 A | 4/1982 | Walker | 324/61 |
| 4,351,016 A | 9/1982 | Felbinger | 361/181 |
| 4,410,843 A | 10/1983 | Sauer et al. | 318/317 |
| 4,453,112 A | 6/1984 | Sauer et al. | 318/281 |
| 5,027,552 A * | 7/1991 | Miller et al. | 49/27 |
| 5,089,672 A * | 2/1992 | Miller | 200/61.43 |
| 5,287,086 A | 2/1994 | Gibb | 340/618 |
| 5,296,658 A * | 3/1994 | Kramer et al. | 200/61.43 |
| 5,327,680 A * | 7/1994 | Miller | 49/27 |
| 5,394,292 A | 2/1995 | Hayashida | 361/179 |

(List continued on next page.)

OTHER PUBLICATIONS

International Search Report for PCT/US02/32584, Dec. 9, 2002, 1 page.

U.S. patent application Ser. No. 10/142,641, filed May 10, 2002 and entitled Method and Apparatus for Detecting a Change in Capacitance of a Capacitive Proximity Sensor, attorney docket No. DP–306074.

U.S. patent application Ser. No. 10/143,141, filed May 10, 2002 and entitled Non–Contact Obstacle Detection System Utilizing Ultra Sensitive Capacitive Sensing, attorney docket No. DP–304425.

U.S. patent application Ser. No.,. 10/142,680, filed May 10, 2002 and entitled Capacitive Sensor Assembly for Use in a Non–Contact Obstacle Detection System, attorney docket No. DP–307244.

http://www.hunting.co.uk/info/ddctheory.htm: Digital Down Conversion (DDC) Theory, pp. 1–6, Jan. 3, 2002.

*Primary Examiner*—Michael A Friedhofer
(74) *Attorney, Agent, or Firm*—Scott A. McBain

(57) ABSTRACT

A flexible, capacitive strip for use in a non-contact obstacle detection system is disclosed. In an exemplary embodiment, the strip includes an elongated body for flexible mounting to a panel along a bottom surface of the elongated body. A first elongated planar conductor is contained within an upper section of the elongated body, and a longitudinal cavity is formed through a central portion of the elongated body, the longitudinal cavity being disposed between the planar conductor and the bottom surface. The first elongated planar conductor forms a first electrode of a sensing capacitor and the longitudinal cavity defines a portion of a dielectric material of the sensing capacitor.

23 Claims, 2 Drawing Sheets

U.S. PATENT DOCUMENTS

| | | | |
|---|---|---|---|
| 5,428,923 A | 7/1995 | Waggamon | 49/28 |
| 5,463,378 A | 10/1995 | Gibb | 340/618 |
| 5,473,461 A | 12/1995 | Miremadi | 359/189 |
| 5,484,477 A | 1/1996 | George et al. | 106/499 |
| 5,651,044 A | 7/1997 | Klotz, Jr. et al. | 378/117 |
| 5,790,107 A | 8/1998 | Kasser et al. | 345/174 |
| 5,801,340 A | 9/1998 | Peter | 178/19 |
| 5,832,772 A | 11/1998 | McEwan | 73/290 |
| 6,006,386 A | 12/1999 | Mohaupt | 7/862.68 |
| 6,025,782 A * | 2/2000 | Newham | 340/573.1 |
| 6,078,014 A * | 6/2000 | Kashiwazaki et al. | 200/61.43 |
| 6,158,170 A * | 12/2000 | Brodowsky | 49/28 |
| 6,166,381 A | 12/2000 | Augeri et al. | 250/332 |
| 6,229,408 B1 | 5/2001 | Jovanovich et al. | 333/167 |
| 6,263,199 B1 | 7/2001 | Wortel et al. | 455/333 |
| 6,275,048 B1 | 8/2001 | Milli | 324/690 |
| 6,282,413 B1 | 8/2001 | Baltus | 455/260 |
| 6,288,640 B1 | 9/2001 | Gagnon | 340/539 |
| 6,297,605 B1 | 10/2001 | Butler et al. | 318/466 |
| 6,321,071 B1 | 11/2001 | Pekkarinen et al. | 455/115 |
| 6,348,862 B1 | 2/2002 | McDonnell et al. | 340/562 |
| 6,377,009 B1 | 4/2002 | Philipp | 318/468 |
| 6,429,782 B2 | 8/2002 | Pavatich et al. | 340/686 |
| 6,455,839 B1 | 9/2002 | O'Connor et al. | 250/221 |
| 6,499,359 B1 | 12/2002 | Washeleski et al. | 73/862.473 |
| 2003/0071639 A1 | 4/2003 | Haag et al. | 324/674 |

\* cited by examiner

FLEXIBLE CAPACITIVE STRIP FOR USE IN A NON-CONTACT OBSTACLE DETECTION SYSTEM

CROSS REFERENCE TO RELATED APPLICATIONS

This application claims the benefit of U.S. provisional application No. 60/330,171, Attorney Docket No. DP-304424, filed Oct. 17, 2001, the contents of which are incorporated by reference herein in their entirety.

This application further claims the benefit of U.S. provisional application No. 60/330,173, Attorney Docket No. DP-306074, filed Oct. 17, 2001, the contents of which are incorporated by reference herein in their entirety.

This application further claims the benefit of U.S. provisional application No. 60/361,803, Attorney Docket No. DP-304424, filed Mar. 5, 2002, the contents of which are incorporated by reference herein in their entirety.

BACKGROUND

The present disclosure relates generally to proximity detecting systems and, more particularly, to a flexible capacitive strip for use in a non-contact obstacle detection system, such as may be implemented in conjunction with a motor vehicle power lift-gate, power operated device, or perimeter system.

Various systems have been devised for detecting obstacles in the path of a moveable panel such as an automotive power window, power sliding door or power hinged door. When an obstacle is detected, forward movement (e.g., closing) of the panel is interrupted and, optionally, the movement of the panel may be thereafter reversed (e.g., opened). These detection systems may generally be characterized as either "contacting" or "non-contacting". In a contacting system, an obstacle is detected only after some form of physical contact occurs between the panel and the obstacle, and may include devices such as pneumatic/pressure sensitive strips, or possibly sensors responsive to changes in mechanical or electrical loading in the apparatus that moves the panel.

On the other hand, in a non-contacting system, an obstacle is detected before actual contact occurs. One specific type of non-contacting obstacle detection system employs the use of a capacitive element(s) as a proximity sensor(s). Capacitive proximity sensors may include one or more electrical conductors formed along the leading edge of a moveable panel, as well as a capacitance sensitive circuit (e.g., a bridge circuit or an oscillator) coupled to the conductor(s). An obstacle (e.g., a human hand) in proximity to the conductor (s) changes the capacitance of the sensor, and the change is thereafter detected by the capacitive sensitive circuit.

Unfortunately, certain problems may arise in creating an appropriate capacitive proximity sensor having the requisite nominal, steady-state capacitance desired for high-sensitive applications, such as the non-contacting obstacle detecting system described above. First, the nominal capacitance value of a capacitive sensing device is inherently dependent upon (among other parameters) the physical dimensions and relative positions of the capacitor electrodes with respect to one another. More specifically, the degree to which the capacitor electrodes are dimensionally consistent with one another along their length will have an effect upon the characteristics of the device. Given the fact that a sensor could be located upon a contoured surface such as a vehicle pillar, panel or moveable lift-gate, the prospect of forming a reliable, sensitive capacitive proximity sensor can therefore be difficult.

Furthermore, it may also be desirable for the sensor to be located in a "tight" area that effectively limits the profile of the sensor, and/or provided in an outdoor setting (such as upon a motor vehicle) that is necessarily exposed to moisture. These variables also have an effect on capacitance and, as such, should be taken into account when designing a high-sensitivity, precision capacitive proximity sensor.

SUMMARY

The above discussed and other drawbacks and deficiencies of the prior art are overcome or alleviated by a flexible, capacitive strip for use in a non-contact obstacle detection system. In an exemplary embodiment, the strip includes an elongated body for flexible mounting to a panel along a bottom surface of the elongated body. A first elongated planar conductor is contained within an upper section of the elongated body, and a longitudinal cavity is formed through a central portion of the elongated body, the longitudinal cavity being disposed between the planar conductor and the bottom surface. The first elongated planar conductor forms a first electrode of a sensing capacitor and the longitudinal cavity defines a portion of a dielectric material of the sensing capacitor.

In a preferred embodiment, the first elongated planar conductor is a first electrode of a sensing capacitor coupled to the capacitance detector circuit. The longitudinal cavity comprises a portion of a dielectric material of the sensing capacitor. In addition, the panel comprises a second electrode of the sensing capacitor. The planar conductor is preferably a flexible material, such that a substantially constant distance is maintained between the first elongated planar conductor and the panel. The elongated body is formed by extrusion of an insulating material such as santoprene rubber.

BRIEF DESCRIPTION OF THE DRAWINGS

Referring to the exemplary drawings wherein like elements are numbered alike in the several Figures:

FIG. 2b is a lateral cross-sectional view of an alternative embodiment of FIG. 2a; and FIG. 2c is an end view of still an alternative embodiment of the capacitive strip.

DETAILED DESCRIPTION

A flexible capacitive strip is disclosed herein. The strip is inexpensive to manufacture, and has a suitably low nominal capacitance (on the order of about 20 picofarads (pF), for example) while still maintaining three dimensional flexibility for mounting to a contoured surface such as on a motor vehicle. The strip has a relatively low profile so as to be able to fit between, for example, a vehicle pillar and a door that closes upon the pillar. In addition, the strip is preferably formed so as to provide moisture resistant protection for the electrode(s) contained therein. In a further aspect, the capacitive sensor strip is also configured for optionally housing capacitance detection circuitry therein.

Figure 1:
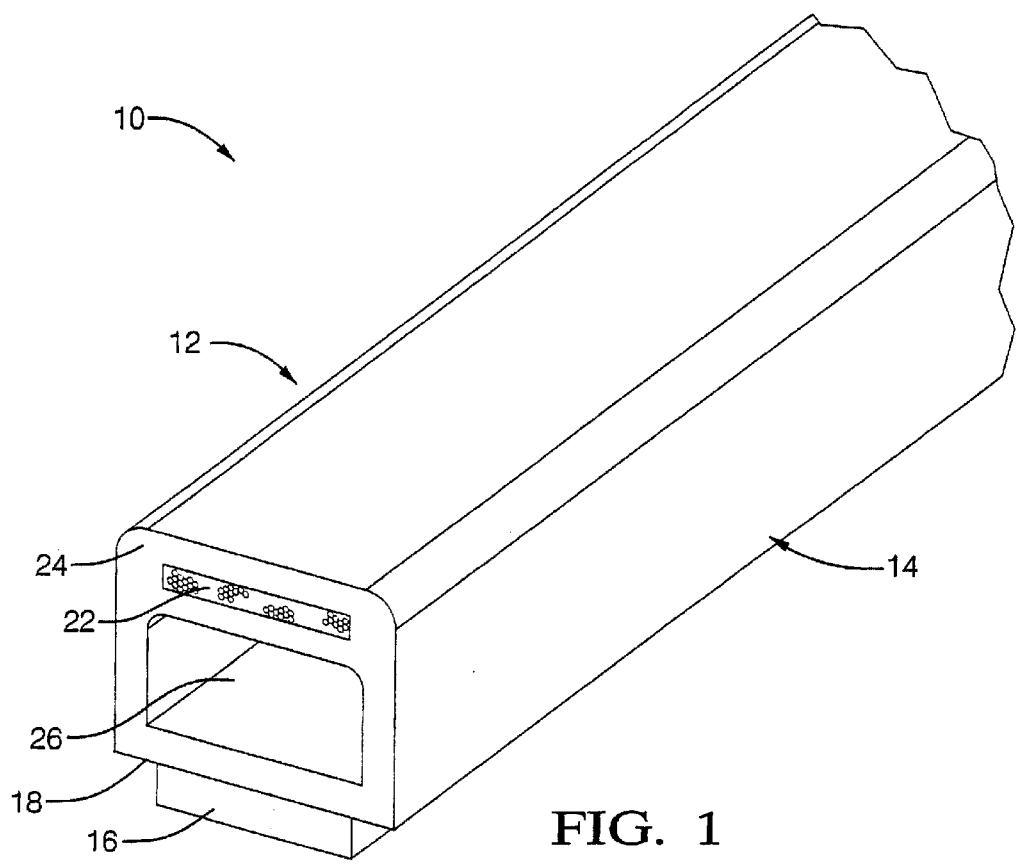
FIG. 1 is a partial perspective view of a flexible capacitive strip that may be used in a non-contact obstacle detection system, in accordance with an embodiment of the invention.
Figure 2A:
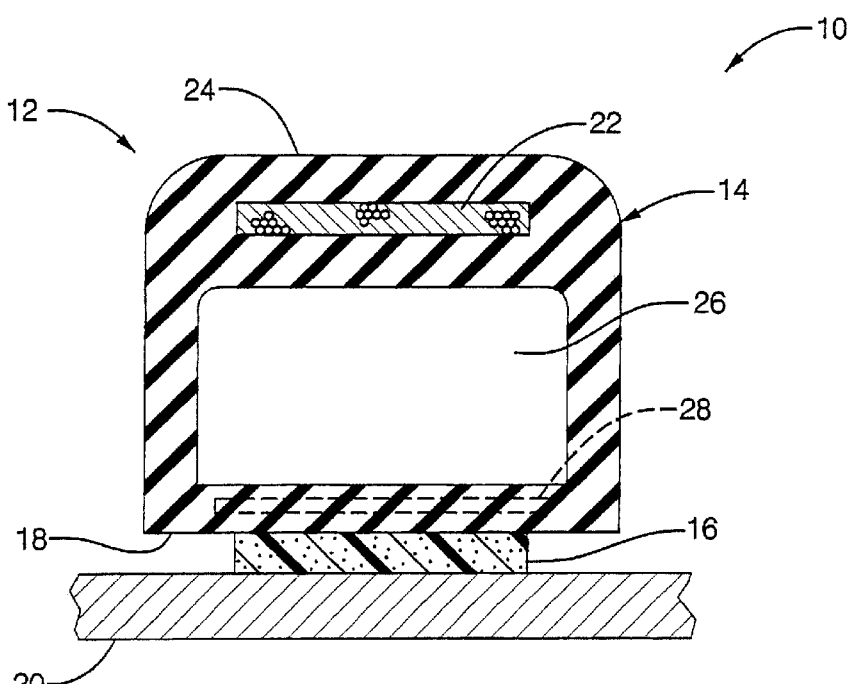
FIG. 2a is a lateral cross-sectional view of the capacitive strip of FIG. 1, shown mounted to a panel.
Figure 2:
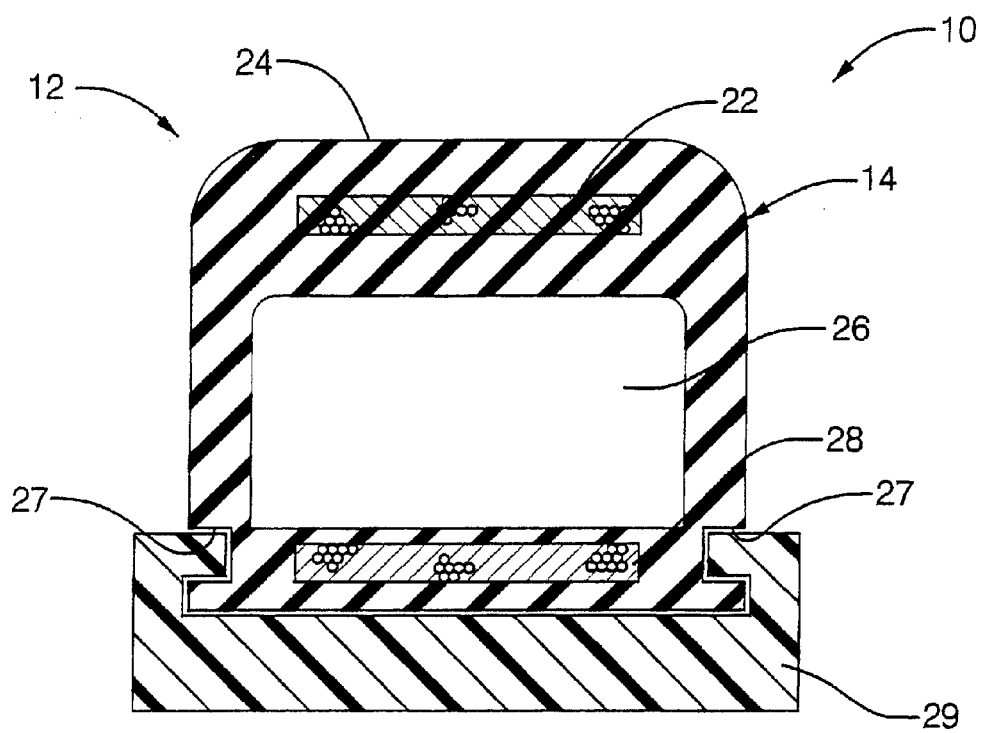
Figure 2:
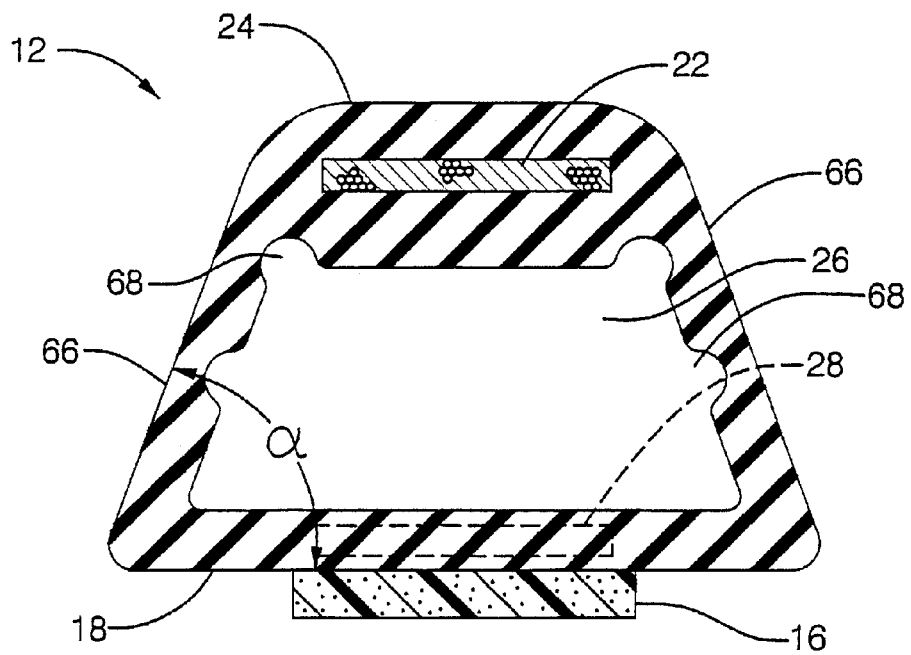

Referring initially to FIGS. 1 and 2a, there is shown a perspective and a lateral cross-sectional view (respectively) of a flexible capacitive sensor strip 12. In accordance with an embodiment of the invention, the sensor strip 12 has a flexible, elongated body 14 with an adhesive strip 16 affixed to a bottom surface 18. The adhesive strip 16 provides a means for securing the strip 12 to a metal panel 20 (e.g., a motor vehicle pillar or lift-gate). The sensor body 14 is preferably formed by extrusion of an insulating, flexible material such as santoprene rubber. Having a dielectric constant or property of 2.3. Of course, other materials having other dielectric properties are contemplated for use in the present disclosure.

A flexible conductor 22 serves as a first electrode of the capacitive strip 12, and is insert molded into an upper portion 24 of the sensor body 14. The conductor 22 is further disposed substantially parallel to the bottom surface 18 and thus should be substantially parallel to the metal panel 20 when the strip 12 is attached thereto, regardless of the particular contours of the panel 20. Preferably, conductor 22 is a flat, braided conductor of tinned copper or the like so as to be flexible in any direction without being damaged, and without resulting in any change to its electrical characteristics along the length thereof. One example of a suitable choice for conductor 22 includes a flat tinned copper braid manufactured by the Alpha Wire Company. The santoprene rubber sensor body 14 covers the entire surface of the flat braid conductor 22 to prevent it from being exposed to moisture and, in addition, the extrusion of the rubber provides a cost effective method for producing several strips 12 (that may be cut to a desired length) from a single process.

In addition to containing the flexible conductor 22, the sensor body 14 further includes a central longitudinal cavity 26 between the upper portion 24 and the lower surface 18. In one aspect, the cavity 26 acts as an air core (i.e., dielectric) separating the conductor 22 from the metal panel 20. In this particular embodiment, the metal panel also serves as a second electrode or ground plane of the strip 12. However, it should also be appreciated that in applications where the strip 12 is to be affixed to a nonmetallic panel or a nonmetallic carrier, a second elongated conductor may be insert molded into the body 14 between the cavity 26 and the bottom surface 18, as is indicated in phantom by the conductor 28 in FIG. 2a.

FIG. 2b illustrates an alternative embodiment of FIG. 2a. Instead of attaching the strip 12 to a metal panel by means of an adhesive strip, the sensor strip 12 may include grooves 27 formed within the outer sides of body 14. The strip 12 may then be slid (by way of grooves 27) into a plastic carrier 29 that holds the strip in place. In turn, the plastic carrier 29 may then be attached to a vehicle surface (not shown), for example, at an appropriate place. It will be noted, however, that in this embodiment, the conductor 28 is used as the second capacitor electrode as there is no direct contact between the strip 12 and a metal surface.

In general, the capacitance C of the sensor strip 12 may be determined from the following equation:

$$C = (\epsilon_o \epsilon_r A)/d$$

where $\epsilon_o$ is the permittivity of free space (8.85 pF/m), $\epsilon_r$ is the relative permittivity (dielectric constant) of the material(s) used to form the strip body 14 (in this case, air and santoprene rubber), A is the surface area of the braided conductor 22, and d is the distance between the electrodes of the capacitor within the strip 12. In the embodiment wherein the panel 20 forms the ground plane of the strip 12, d is the distance from the braided conductor 22 to the panel 20. Alternatively, d is the distance from the braided conductor 22 to the second braided conductor 28.

Accordingly, it will be appreciated that the above described configuration for the capacitive strip 12 is advantageous in that its flexibility allows it to conform to the profile of a contoured surface such as a motor vehicle while still providing a uniformly shaped conductor therein that can remain substantially parallel to the contoured surface itself. Moreover, the santoprene rubber material, among other advantages, provides protection for the conductor from outside elements, such as moisture, which could otherwise adversely affect the sensitivity of the strip 12. It will further be noted that the size of the strip 12 may be tailored according to the specific application, taking into consideration the value of capacitance desired to be used in the associated sensing circuitry. For example, a capacitive strip 12 intended for use in a capacitive proximity sensor for a motor vehicle lift gate may have a width of about 10 millimeters (mm) and a thickness or height of about 8 mm. Again, however, it will be understood that the general configuration for the capacitive strip may have several other applications and, thus, other sizes.

When the capacitive strip 12 is used in conjunction with some type of capacitance detection circuitry, an external connection may be needed to connect the conductor 22 to the circuitry. Accordingly, any external wire, lead, or other connection to conductor should also be provided with a sealing material so as to maintain the protection of the conductor 22 from moisture and other conditions. This is also the case for any end of the strip 12 that has been cut to a desired length; a cut end of the strip 12 is preferably also provided with a protective end mold (e.g., rubber) to seal the tip of the conductor 22.

Finally, FIG. 2c illustrates an end view of an alternative embodiment of the capacitive strip 12. The capacitive strip 12 may have a cross section that is generally trapezoidal in shape, wherein the side surfaces 66 of the strip are upwardly tapered as determined by an acute angle, α, with respect to the bottom surface 18. In addition, the cavity 26 may be formed to include curved protrusions 68 within the material of the strip 12. Thus configured, strip 12 may be made more resistant to inward compression of the side surfaces 66. If pressure is applied to the upper portion 24 of the strip 12, the upper portion 24 will move straight downward, but will more readily return to its original position when the compressive force is removed.

Additionally, cavity 26 provides a means or area for receiving and holding an electronic circuit configured for use with the capacitive strip of the present disclosure.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A flexible, capacitive strip for use in a non-contact obstacle detection system, the strip comprising:
    an elongated body for flexible mounting to a panel along a bottom surface of said elongated body;
    a first elongated planar conductor contained within an upper section or said elongated body; and a longitudinal cavity formed through a central portion of said elongated body, said longitudinal cavity being disposed between said planar conductor and said bottom surface;

wherein said first elongated planar conductor further comprises a first electrode of a non-contact sensing capacitor and said longitudinal cavity comprises a portion of a dielectric material of said non-contact sensing capacitor.

2. The capacitive strip of claim 1, wherein said panel comprises a second electrode of said non-contact sensing capacitor.

3. The capacitive strip of claim 1, wherein said planar conductor comprises a flexible material such that a substantially constant distance is maintained between said first elongated planar conductor and said panel.

4. The capacitive strip of claim 1, wherein said elongated body is formed by extrusion of an insulating material.

5. The capacitive strip of claim 4, wherein said insulating material further comprises santoprene rubber.

6. The capacitive strip of claim 5, wherein a dielectric constant of said capacitive strip is determined by both said longitudinal cavity and said santoprene rubber.

7. The capacitive strip of claim 4, wherein said insulating material surrounds said first elongated planar conductor.

8. The capacitive strip of claim 1, wherein said first elongated planar conductor further comprises braided wire.

9. The capacitive strip of claim 8, wherein said braided wire is formed from tinned copper material.

10. The capacitive strip of claim 1, further comprising an adhesive strip affixed to said bottom surface of said elongated body.

11. The capacitive strip of claim 1, further comprising:

a second elongated planar conductor, formed within said elongated body;

said second elongated planar conductor being disposed substantially parallel to said first elongated planar conductor, with said longitudinal cavity further being disposed between said first elongated planar conductor and said elongated planar conductor;

wherein said second elongated planar conductor further comprises a second electrode of said non-contact sensing capacitor.

12. The capacitive strip of claim 11, wherein said elongated body includes a pair of grooves therein, said grooves thereby allowing said elongated body to be slid into and mounted within a carrier.

13. The capacitive strip of claim 12, wherein said insulating material surrounds said first elongated planar conductor.

14. The capacitive strip of claim 11, wherein said longitudinal cavity provides a dielectric between said first planar conductor and said second planar conductor.

15. The capacitive strip of claim 1, wherein said elongated body provides a moisture resistant covering for the first elongated planar conductor disposed therein.

16. The capacitive strip of claim 1, wherein said elongated body has a dielectric property or constant of approximately 2.3.

17. The capacitive strip of claim 1, wherein said longitudinal cavity is defined by a pair of side walls, said upper section and said elongated body wherein a cross section of the capacitive strip has a trapezoidal configuration.

18. The capacitive strip of claim 17, wherein said longitudinal cavity comprises curved protrusions disposed within the material of said elongated body, said curved protrusions causing said elongated body to be more resilient to compression forces.

19. A flexible, capacitive strip for use in a non-contact obstacle detection system of a vehicle, the strip comprising:

an elongated body for flexible mounting to a surface of the vehicle along a bottom surface of said elongated body;

a first elongated planar conductor contained within an upper section of said elongated body; and a longitudinal cavity formed through a central portion of said elongated body, said longitudinal cavity being disposed between said planar conductor and said bottom surface;

wherein said first elongated planar conductor further comprises a first elctrode of a non-contact sensing capacitor and said longitudinal cavity comprises a portion of a dielectric material of said non-contact sensing capacitor.

20. The capacitive strip of claim 19, wherein the capacitive strip is capable of conforming to the surface of the vehicle and said first elongated planar conductor is maintained in a parallel spaced relationship with respect to the surface of the vehicle.

21. The capacitive strip of claim 20, further comprising:

a second elongated planar conductor, formed within said elongated body;

said second elongated planar conductor being disposed substantially parallel to said first elongated planar conductor, with said longitudinal cavity further being disposed between said first elongated planar conductor and said elongated planar conductor;

wherein said second elongated planar conductor further comprises a second electrode of said non-contact sensing capacitor.

22. The capacitive strip of claim 21, wherein said longitudinal cavity is defined by a pair of side walls, said upper section and said elongated body wherein a cross section of the capacitive strip has a trapezoidal configuration.

23. The capacitive strip of claim 22, wherein said longitudinal cavity comprises curved protrusions disposed within the material of said elongated body, said curved protrusions causing said elongated body to be more resilient to compression forces.

* * * * *